US012604639B2

(12) United States Patent
Ha

(10) Patent No.: US 12,604,639 B2
(45) Date of Patent: Apr. 14, 2026

(54) DISPLAY DEVICE

(71) Applicant: LG Display Co., Ltd., Seoul (KR)

(72) Inventor: Donghoon Ha, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 544 days.

(21) Appl. No.: 17/976,571

(22) Filed: Oct. 28, 2022

(65) Prior Publication Data

US 2023/0189550 A1 Jun. 15, 2023

(30) Foreign Application Priority Data

Dec. 13, 2021 (KR) ........................ 10-2021-0177731

(51) Int. Cl.
| | |
|---|---|
| *G06F 3/041* | (2006.01) |
| *H10K 59/80* | (2023.01) |
| *H10K 59/12* | (2023.01) |

(52) U.S. Cl.
CPC ......... *H10K 59/873* (2023.02); *G06F 3/0412* (2013.01); *G06F 2203/04102* (2013.01); *H10K 59/12* (2023.02)

(58) Field of Classification Search
None
See application file for complete search history.

(56) References Cited

U.S. PATENT DOCUMENTS

| | | | |
|---|---|---|---|
| 9,147,723 B1 | 9/2015 | Lee et al. | |
| 11,036,325 B2 | 6/2021 | Lee et al. | |
| 11,392,234 B2 | 7/2022 | Lee et al. | |
| 2019/0073073 A1 | 3/2019 | Kato | |
| 2019/0088198 A1 | 3/2019 | Kang et al. | |
| 2020/0135812 A1* | 4/2020 | Ohara | ................. G06F 3/04164 |
| 2020/0184871 A1 | 6/2020 | Hong et al. | |
| 2021/0064172 A1 | 3/2021 | Lee et al. | |
| 2021/0091164 A1 | 3/2021 | Kim et al. | |
| 2021/0263608 A1 | 8/2021 | Lee et al. | |

FOREIGN PATENT DOCUMENTS

| | | |
|---|---|---|
| CN | 105374843 A | 3/2016 |
| CN | 111276105 A | 6/2020 |
| CN | 112530992 A | 3/2021 |
| JP | 2019-152695 A | 9/2019 |

(Continued)

OTHER PUBLICATIONS

Intellectual Property Office of the United Kingdom, Office Action, GB Patent Application No. 2215566.7, Mar. 27, 2023, five pages.

(Continued)

*Primary Examiner* — Brian M Butcher
(74) *Attorney, Agent, or Firm* — Fenwick & West LLP

(57) ABSTRACT

The present disclosure relates to a display device including a first substrate including an active area and a non-active area which encloses the active area, a display unit disposed on an upper surface of the first substrate, an encapsulation unit which covers the display unit, a touch panel disposed on the encapsulation unit, an adhesive layer which bonds the touch panel and the first substrate, and a polarizer disposed on the touch panel, the touch panel includes a plurality of touch insulating layers and a touch electrode and ends of the plurality of touch insulating layers are spaced apart from an end of the polarizer.

14 Claims, 5 Drawing Sheets

(56)        References Cited

FOREIGN PATENT DOCUMENTS

| KR | 10-2016-0069836 A | 6/2016 |
|----|-------------------|--------|
| KR | 10-2019-0080281 A | 7/2019 |
| KR | 10-2021-0026454 A | 3/2021 |
| WO | WO 2020/258869 A1 | 12/2020 |

OTHER PUBLICATIONS

Ministry of Intellectual Property of Korea, Office Action, Korean Patent Application No. 10-2021-0177731, Dec. 9, 2025, 10 pages.
China National Intellectual Property Administration, Office Action, Chinese Patent Application No. 202211286422.0, Jan. 10, 2026, 11 pages.

* cited by examiner

DISPLAY DEVICE

CROSS-REFERENCE TO RELATED APPLICATIONS

This application claims the priority of Korean Patent Application No. 10-2021-0177731 filed on Dec. 13, 2021, in the Korean Intellectual Property Office, the disclosure of which is incorporated herein by reference.

BACKGROUND

Field

The present disclosure relates to a display device, and more particularly, to a display device which is capable of reducing a defect rate of a display device due to stress concentration.

Description of the Related Art

As the information society develops, demands for display devices which display images is increasing and various types of display devices such as a liquid crystal display device or an organic light emitting display device are utilized.

In order to provide more various functions to users, such a display device provides a function of recognizing a touch on a display panel of a user and performing input processing based on the recognized touch.

A display device which is capable of recognizing a touch includes a plurality of touch electrodes which are disposed or embedded in the display panel and drives the touch electrode to detect the presence of the touch of the user for the display panel or a touch coordinate.

SUMMARY

An object to be achieved by the present disclosure is to provide a display device in which even though a polarizer is shrunk when the high temperature and high humidity reliability is evaluated, a stress caused by the shrinkage is not applied to a plurality of touch insulating layers so that a damage of a film therebelow is suppressed.

Another object to be achieved by the present disclosure is to provide a display device which improves a reliability by reducing a defect rate when the high temperature and high humidity reliability is evaluated.

Objects of the present disclosure are not limited to the above-mentioned objects, and other objects, which are not mentioned above, can be clearly understood by those skilled in the art from the following descriptions.

According to an aspect of the present disclosure, a display device includes a first substrate including an active area and a non-active area which encloses the active area, a display unit disposed on an upper surface of the first substrate, an encapsulation unit which covers the display unit, a touch panel disposed on the encapsulation unit, an adhesive layer which bonds the touch panel and the first substrate, and a polarizer disposed on the touch panel, the touch panel includes a plurality of touch insulating layers and a touch electrode and ends of the plurality of touch insulating layers are spaced apart from an end of the polarizer. Accordingly, the stress due to the shrinkage of the polarizer is suppressed from being concentrated on the plurality of touch insulating layers during the evaluation of the high temperature and high humidity reliability to reduce a defect rate of the display device due to the stress concentration.

Other detailed matters of the exemplary embodiments are included in the detailed description and the drawings.

According to the present disclosure, ends of a plurality of touch insulating layers are disposed to be spaced apart from an end of a polarizer so that the stress due to the shrinkage of the polarizer during the evaluation of the high temperature and high humidity reliability is suppressed from being concentrated onto the plurality of touch insulating layers. By doing this, the reliability of the display device may be improved.

Further, according to the present disclosure, even though a damage is caused on the plurality of touch insulating layers due to the stress concentration, the plurality of touch insulating layers are configured to have different lengths to disperse the damage which may occur in the plurality of touch insulating layers. By doing this, the reliability of the display device may be further improved.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
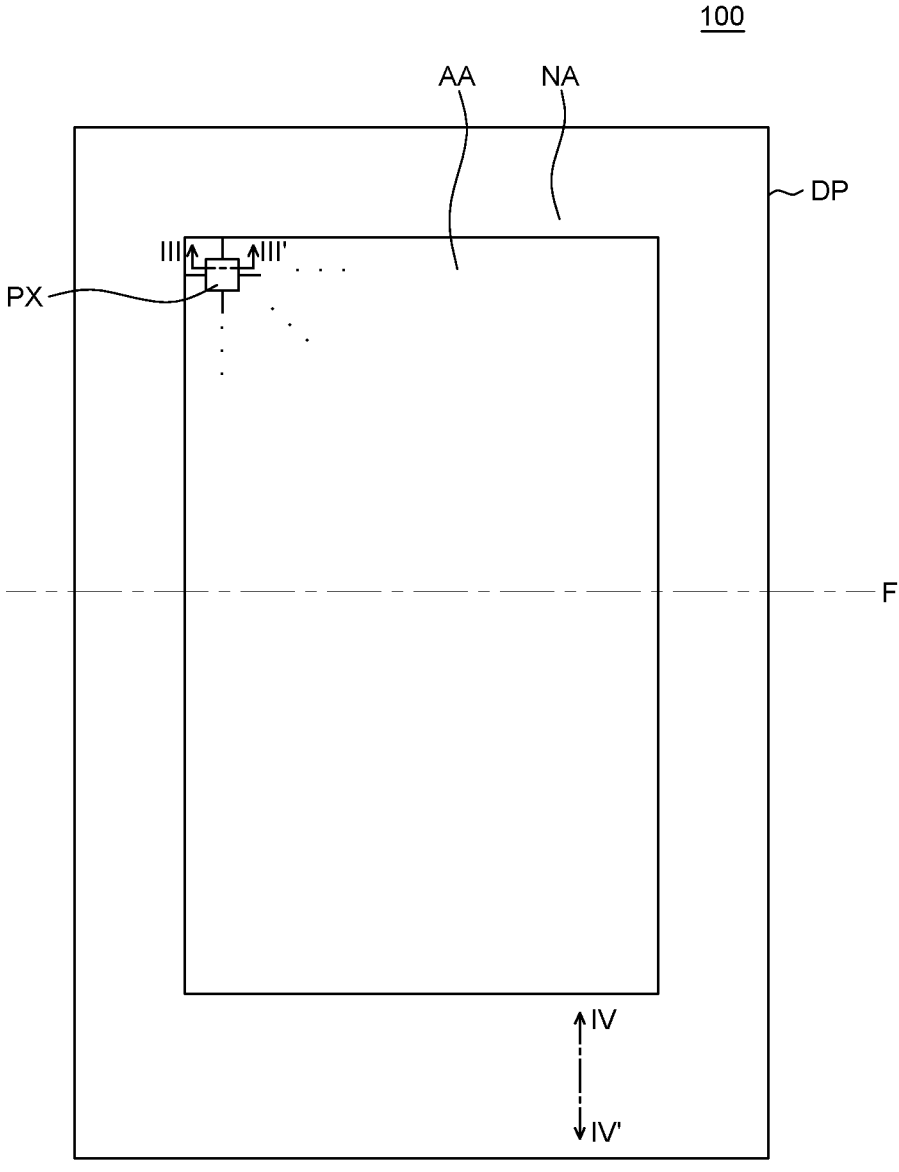
FIG. 1 is a schematic plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, the element or layer may be directly disposed on the other element, or another layer or another element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings.

FIG. 1 is a schematic plan view of a display device 100 according to an exemplary embodiment of the present disclosure.

Referring to FIG. 1, a display device 100 includes a display panel DP.

The display panel DP includes a substrate using glass or plastic and a plurality of gate lines and a plurality of data lines disposed on the substrate to intersect each other. A plurality of pixels PX are defined at intersections of the plurality of gate lines and data lines. An area in which a plurality of pixels implementing images are disposed is referred to as an active area AA and an area disposed at the outside of the active area AA in which the plurality of pixels PX are not disposed is referred to as a non-active area NA.

In the active area AA, a display unit for displaying images and a circuit unit for driving the display unit may be disposed. For example, when the display device 100 is an organic light emitting display device, the display unit may include a light emitting diode. The display unit may include an anode, an organic light emitting layer on the anode, and a cathode on the organic light emitting layer. For example, the organic light emitting layer may be configured by a hole transport layer, a hole injection layer, an organic emission layer, an electron injection layer, and an electron transport layer. However, when the display device 100 is a liquid crystal display device, the display unit may be configured to include a liquid crystal layer. Hereinafter, for the convenience of description, it is assumed that the display device 100 is an organic light emitting display device, but is not limited thereto.

The circuit unit may include various thin film transistors, capacitors, and wiring lines for driving the light emitting diode. For example, the circuit unit may be configured by various components such as a driving transistor, a switching transistor, a storage capacitor, a gate line, and a data line, but is not limited thereto.

The non-active area NA is an area where no image is displayed and various wiring lines and circuits for driving the display unit disposed in the active area AA are disposed.

The non-active area NA may be defined as an area which encloses the active area AA as illustrated in FIG. 1, but it is not limited thereto and the non-active area NA may be defined as an area extending from the active area AA. Further, the non-active area NA may be defined to extend from a plurality of sides of the active area AA.

In the non-active area NA, a COF or an FPCB in which various ICs such as a gate driver IC and a data driver IC and driving circuits are disposed may be disposed. Further, in the non-active area NA, a driving circuit referred to as a gate in panel (GIP) may be disposed.

Further, an area of the display panel DP is divided depending on whether to be folded, and for example, the display panel may be folded along a direction perpendicular to a folding axis F. For example, the folding axis F may be formed in both a part of the active area AA and a part of the non-active area NA. When the display panel DP is folded with respect to a direction perpendicular to the folding axis F, the display panel DP may be folded while forming a part of a circle or an oval.

Hereinafter, the touch panel of the display device 100 according to the exemplary embodiment of the present disclosure will be described in more detail with reference to FIG. 2 together.

Figure 2:
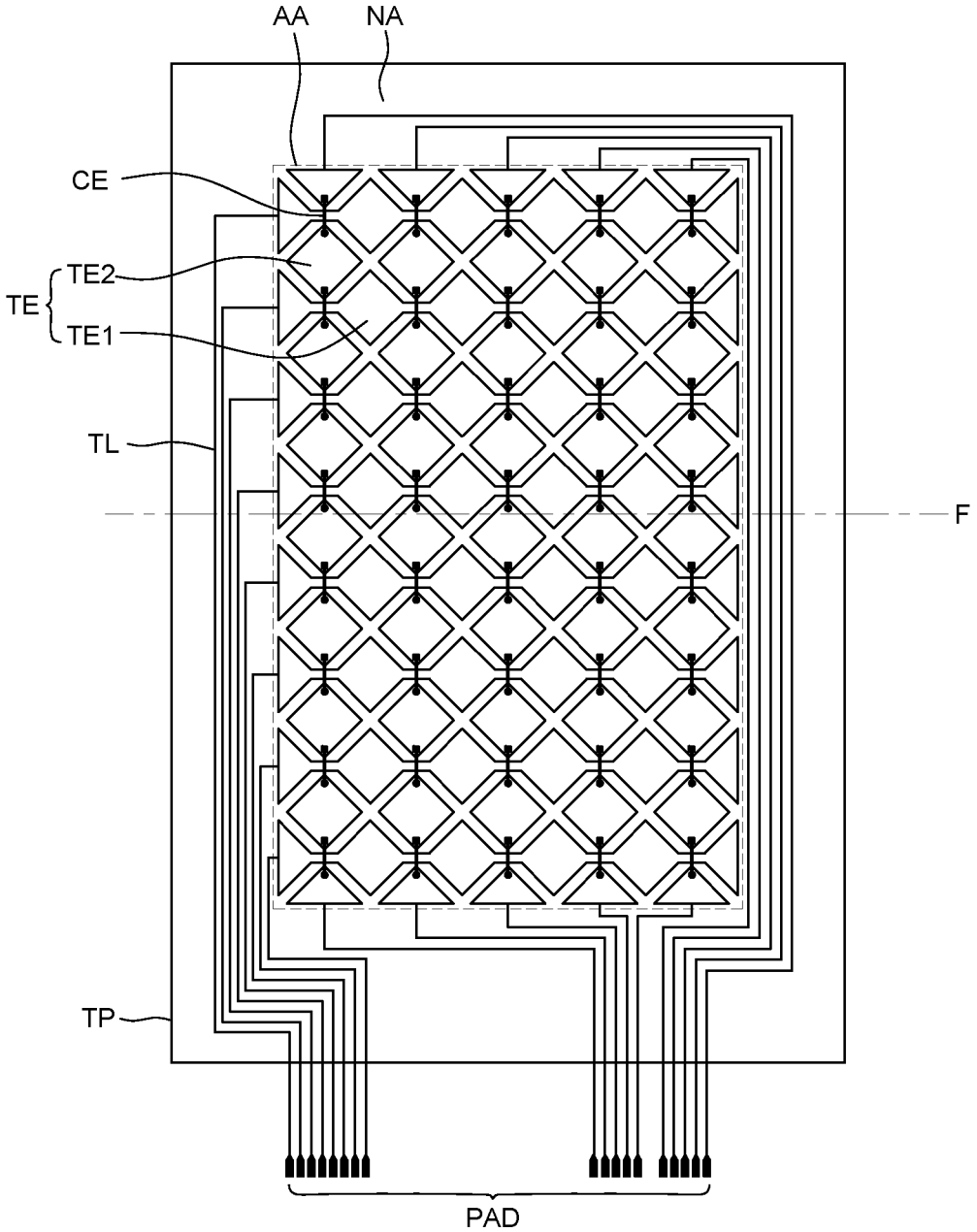
FIG. 2 is a plan view schematically illustrating a touch panel of a display device according to an exemplary embodiment of the present disclosure.

FIG. 2 is a plan view schematically illustrating a structure of a touch panel TP which is applicable to a display device according to an exemplary embodiment of the present disclosure.

The touch panel TP senses a touch input of a user.

Specifically, the touch panel TP is referred to as a touch sensing unit.

The touch panel TP may be manufactured separately from the display panel DP to be attached onto the display panel DP as an add-on type or may be embedded in the display panel DP.

Specifically, when the touch panel TP is separately manufactured from the display panel DP to be attached onto the display panel DP in an add-on type, the touch panel TP may be attached to the display panel DP by means of an adhesive layer. However, a shape of the touch panel TP is not limited to the above-described type, but may vary depending on the necessity of the design.

The touch panel TP further includes a touch driver which supplies a touch driving signal to the touch panel TP and detects a touch sensing signal from the touch panel TP.

The touch driver determines the presence of the user's touch and a touch position. That is, when the user touches a partial area of the touch panel TP, the touch driver senses a touch signal to determine whether the user touches the touch panel TP and a touch position.

Specifically, the touch driver supplies the touch driving signal to each touch panel TP. The touch driver is applied with a touch sensing signal from the touch panel TP. The touch driver may sense the touch in the touch panel TP by the touch sensing signal.

The touch panel TP includes a plurality of first touch electrodes TE1, a plurality of second touch electrodes TE2, a plurality of touch routing lines TL, and a plurality of touch pads PAD.

The plurality of first touch electrodes TE1 may be touch driving electrodes and the plurality of second touch electrodes TE2 may be touch sensing electrodes. The plurality of first touch electrodes TE1 are connected in a row direction to form a plurality of electrode rows and the plurality of second touch electrodes TE2 is connected in a vertical direction by the connection electrode CE to form a plurality of electrode columns.

The first touch electrode TE1 and the second touch electrode TE2 may be disposed on the same layer. However, in an area where the first touch electrodes TE1 and the second touch electrodes TE2 intersect, the second touch electrodes TE2 are disposed to be separated and the separated second touch electrodes TE2 may be connected by the connection electrode CE.

At this time, the first touch electrodes TE1, the second touch electrodes TE2, and the connection electrode CE are disposed in an area corresponding to the active area AA of the display panel DP.

An outer appearance of the first touch electrode TE1 and the second touch electrode TE2 may correspond to a specific shape. For example, as illustrated in FIG. 2, the outer appearance of the first touch electrode TE1 and the second touch electrode TE2 may have a mesh pattern including a plurality of rhombus shapes. The first touch electrode TE1 and the second touch electrode TE2 may be formed of a metal including at least one of titanium (Ti), aluminum (Al), molybdenum (Mo), molytitanium (MoTi), copper (Cu), and tantalum (Ta) or formed of a transparent conductive material such as indium tin oxide (ITO) or indium zinc oxide (IZO). However, they are not limited thereto. Light emitted from the display device 100 passes through the first touch electrode TE1 and the second touch electrode TE2 formed of a transparent conductive material to be emitted to the outside. However, it is not limited thereto so that light emitted from the display device 100 may be emitted to the outside by means of a plurality of openings included in the first touch electrode TE1 and the second touch electrode TE2.

The non-active area NA is an area enclosing the active area AA and in the non-active area, a plurality of touch routing lines TL and a plurality of touch pads PAD are disposed.

Similar to the display panel DP, the area of the touch panel TP is divided depending on whether to be folded and for example, the folding axis F may be included in the touch panel TP so as to correspond to the folding axis F of the display panel DP. At this time, the display device 100 including the display panel DP and the touch panel TP may be folded with respect to the folding axis F.

Each of the plurality of touch routing lines TL electrically connects each of the plurality of touch electrodes TE disposed in the active area AA and the touch pad PAD of the non-active area NA. For example, a touch driving signal is applied to the first touch electrode TE1 by means of a touch routing line TL connected to the first touch electrode TE1 and a touch sensing signal is received from the second touch electrode TE2 by means of a touch routing line TL connected to the second touch electrode TE2.

Such a touch routing line TL may be formed of a low resistive metal material and is also formed of a transparent conductive material, such as ITO or IZO, but is not limited thereto. For example, when the plurality of touch routing lines TL are formed of a low resistive metal material, the resistance thereof is degraded so that the RC delay may be degraded.

One ends of the plurality of touch pads PAD are connected to the touch routing lines TL and the other ends are connected to an external circuit such as a touch driver to receive the touch driving signal from the external circuit or transmit the touch sensing signal to the external circuit.

At this time, the plurality of touch routing lines TL and the plurality of touch pads PAD are disposed in an area of the display panel DP corresponding to the non-active area NA.

Here, a cross-sectional structure of the active area AA of the display device 100 will be described in more detail with reference to FIG. 3.

Figure 3:
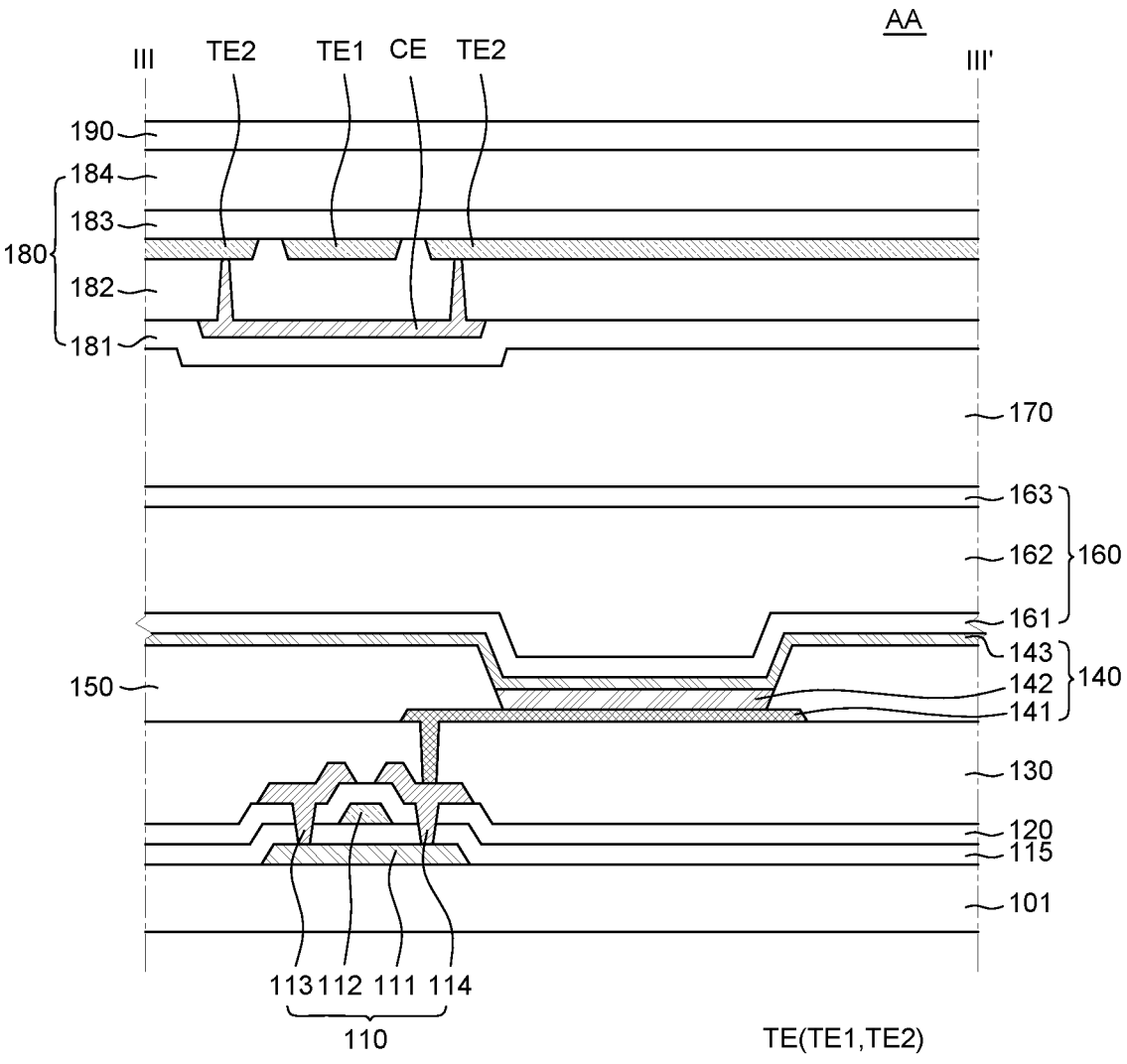
FIG. 3 is a schematic cross-sectional view taken along the line III-III' of FIG. 1.

FIG. 3 is a schematic cross-sectional view taken along the line III-III' of FIG. 1. Specifically, FIG. 3 is a cross-sectional view illustrating one pixel PX of the active area AA of the display device 100 according to the exemplary embodiment of the present disclosure.

Referring to FIG. 3, the substrate 101 supports various components of the display device 100. The substrate 101 may be formed of a transparent insulating material, for example, an insulating material, such as glass or plastic. For example, the substrate 101 includes a substrate using glass or plastic. Specifically, when the substrate includes an insulating plastic substrate selected from polyimide, polyethersulfone, polyethylene terephthalate, and polycarbonate, the substrate may have a flexibility. But embodiments are not limited thereto. For example, the substrate 101 may be formed of a semitransparent insulating material or an opaque insulating material.

In the active area AA of the substrate 101, the transistor 110 which drives each pixel is disposed. The transistor 110 includes an active layer 111, a gate electrode 112, a source electrode 113, and a drain electrode 114.

The active layer 111 is disposed on the substrate 101. The active layer 111 may be formed of polysilicon (p-Si), amorphous silicon (a-Si), or oxide semiconductor, but is not limited thereto.

The gate insulating layer 115 is disposed on the substrate 101 and the active layer 111. The gate insulating layer 115 may be formed of silicon oxide SiOx, silicon nitride SiNx, or multiple layers thereof.

The gate electrode 112 is disposed on the gate insulating layer 115. The gate electrode 112 is disposed on the gate insulating layer 115 so as to overlap the active layer 111. The gate electrode 112 may be formed of various conductive materials, for example, magnesium (Mg), aluminum (Al), nickel (Ni), chrome (Cr), molybdenum (Mo), tungsten (W), gold (Au), or an alloy thereof, but is not limited thereto.

An interlayer insulating layer 120 is disposed on the gate insulating layer 115 and the gate electrode 112. The interlayer insulating layer 120 may be formed of silicon oxide SiOx, silicon nitride SiNx, or multiple layers thereof.

The source electrode 113 and the drain electrode 114 are disposed on the interlayer insulating layer 120. The source electrode 113 and the drain electrode 114 are electrically connected to the active layer 111 through the contact holes formed in the gate insulating layer 115 and the interlayer insulating layer 120. The source electrode 113 and the drain electrode 114 may be formed of various conductive materials, for example, magnesium (Mg), aluminum (Al), nickel (Ni), chrome (Cr), molybdenum (Mo), tungsten (W), gold (Au), or an alloy thereof, but is not limited thereto.

Even though it is not illustrated, a buffer layer may be located between the substrate 101 and the transistor 110, specifically, between the substrate 101 and the active layer

111. The buffer layer is a layer for protecting the transistor from impurities such as alkali ions leaked from the substrate 101 or layers therebelow. The buffer layer may be formed of silicon oxide SiOx, silicon nitride SiNx, or multiple layers thereof.

A planarization layer 130 is disposed on the transistor 110. The planarization layer 130 protects the transistor 110 and planarizes an upper portion of the transistor. For example, the planarization layer 130 may be formed of an organic insulating layer, such as benzocyclobutene (BCB) or acryl, but is not limited thereto.

The light emitting diode 140 is disposed on the planarization layer 130. The light emitting diode 140 includes an anode 141, an organic light emitting layer 142, and a cathode 143.

The anode 141 is formed on the planarization layer 130 so as to correspond to an emission area of each pixel. The anode 141 is electrically connected to the drain electrode 114 of the transistor 110 by means of a contact hole of the planarization layer 130. The anode 141 may be configured by a metallic material having a high work function. When the display device 100 is a top emission type, the anode 141 may further include a transparent conductive layer and a reflective layer below the transparent conductive layer.

The transparent conductive layer may be formed of transparent conductive oxide such as ITO or IZO and the reflective layer may be formed of silver (Ag), aluminum (Al), gold (Au), molybdenum (Mo), tungsten (W), chrome (Cr), or an alloy thereof.

A bank layer 150 is formed in a remaining area excluding an emission area. Therefore, the bank layer 150 exposes the anode 141 corresponding to the emission area. The bank layer 150 may be formed of an inorganic insulating material, such as silicon nitride (SiNx) or silicon oxide (SiOx), or an organic insulating material, such as benzocyclobutene (BCB) resin, acrylic resin or imide resin, but is not limited thereto.

Even though it is not illustrated, a spacer may be further formed on the bank layer 150. The spacer may be formed of the same material as the bank layer 150. The spacer may serve to protect a damage of the light emitting diode 140 which may be caused by a fine metal mask (FMM) used to pattern the organic light emitting layer 142.

The organic light emitting layer 142 is disposed on the anode 141 exposed by the bank layer 150. The organic light emitting layer 142 includes a hole injection layer, a hole transport layer, a light emitting layer, an electron transport layer, and an electron injection layer. The organic light emitting layer 142 may be configured with a single emission layer structure which emits single light or may be configured with a structure which is configured by a plurality of emission layers to emit white light.

The cathode 143 is disposed on the organic light emitting layer 142. When the light emitting display device 100 is a top emission type, the cathode 143 may be formed of a metal material having a small thickness and a high work function.

An encapsulation unit 160 is disposed on the cathode 143. The encapsulation unit 160 may protect the light emitting diode 140 from the moisture and oxygen. When the light emitting diode 140 is exposed to the moisture or oxygen, the pixel shrinkage phenomenon in which the light emitting diode 140 is shrunk occurs or a dark spot is generated in the emitting area.

For example, the encapsulation unit 160 includes a first inorganic encapsulation layer 161, an organic encapsulation layer 162 on the first inorganic encapsulation layer 161, and a second inorganic encapsulation layer 163 on the organic encapsulation layer 162. The first inorganic encapsulation layer 161 and the second inorganic encapsulation layer 163 are formed by inorganic insulating layers. For example, the first inorganic encapsulation layer 161 and the second inorganic encapsulation layer 163 may be formed of an inorganic insulating material such as silicon nitride (SiNx), silicon oxide (SiOx), silicon oxynitride (SiON), or aluminum oxide (Al2O3). The organic encapsulation layer 162 is formed of an organic insulating layer. The second inorganic encapsulation layer 163 covers upper surfaces and side surfaces of the first inorganic encapsulation layer 161 and the organic encapsulation layer 162. The second inorganic encapsulation layer 163 minimizes or blocks external moisture or oxygen from permeating the first inorganic encapsulation layer 161 and the organic encapsulation layer 162. At this time, the first inorganic encapsulation layer 161 and the second inorganic encapsulation layer 163 serve to block the permeation of moisture or oxygen and the organic encapsulation layer 162 serves to planarize an upper portion of the first inorganic encapsulation layer 161. However, a configuration of the encapsulation unit 160 is not limited thereto.

In the meantime, the touch panel TP is disposed on the encapsulation unit 160 to be bonded to the display panel DP by the adhesive layer 170. The adhesive layer 170 is configured by an adhesive material to bond the encapsulation unit 160 and the touch panel TP. The adhesive layer 170 seals the light emitting diode 140 to protect the light emitting diode 140 from the permeation of the moisture or oxygen from the outside of the display device 100. As the adhesive layer 170, various materials may be used, and for example, various adhesive materials such as optical clear adhesive or optical clear resin may be used.

The touch panel TP corresponding to the active area AA of the display device 100 includes a plurality of touch insulating layers 180, and touch electrodes TE, and a polarizer 190 disposed on the plurality of touch insulating layers 180 and touch electrodes TE.

The plurality of touch insulating layers 180 include a touch protection layer 181, a touch interlayer insulating layer 182 on the touch protection layer 181, a barrier layer 183 on the touch interlayer insulating layer 182, and a touch planarization layer 184 on the barrier layer 183.

The touch protection layer 181 is in contact with the adhesive layer 170 when the touch panel TP is bonded to the display panel DP by means of the adhesive layer 170. The touch protection layer 181 is formed of an inorganic insulating material, and for example, formed of silicon oxide (SiOx), silicon nitride (SiNx), or a multilayer thereof. The touch protection layer 181 protects the touch electrode TE and the connection electrode CE disposed on the touch protection layer 181.

The connection electrode CE is disposed on the touch protection layer 181. The connection electrode CE is disposed in the intersections of the touch electrodes TE disposed in different directions to be used to connect the touch electrodes TE disposed in one direction. The connection electrode CE may be formed of a transparent conductive material and for example, formed of a transparent conductive oxide, such as ITO or IZO.

The touch interlayer insulating layer 182 may be disposed on the connection electrode CE and the touch protection layer 181. The touch interlayer insulating layer 182 insulates the connection electrode CE from the touch electrode TE. The touch interlayer insulating layer 182 may be formed of an organic insulating material, and for example, formed of an acryl, epoxy, or siloxane based material.

The barrier layer 183 is disposed so as to cover the touch electrode TE. The barrier layer 183 is formed of an inorganic film, and for example, formed of silicon oxide SiOx, silicon nitride SiNx, or a multilayer thereof. The barrier layer 183 suppresses the damage of the touch electrode TE caused by the moisture from the outside.

The touch planarization layer 184 is disposed on the barrier layer 183. The touch planarization layer 184 is disposed so as not to expose the barrier layer 183 to the outside to perform a substantially similar function to the substrate. The touch planarization layer 184 may be formed of an organic insulating material, and for example, formed of an acryl, epoxy, or siloxane based material.

The polarizer 190 suppress reflection of external light on the active area AA of the substrate 101. When the display device 100 is used at the outside, external natural light enters to be reflected by a reflective layer included in the anode 141 of the light emitting diode or reflected by an electrode which is formed of a metal and disposed below the light emitting diode 140. Therefore, the image of the display device 100 may not be visibly recognized due to the light reflected as described above. The polarizer 190 polarizes the light entering from the outside to a specific direction and suppresses the reflected light from being emitted to the outside of the display device 100.

Here, a cross-sectional structure of the non-active area NA of the display device 100 will be described in more detail with reference to FIG. 4.

Figure 4:
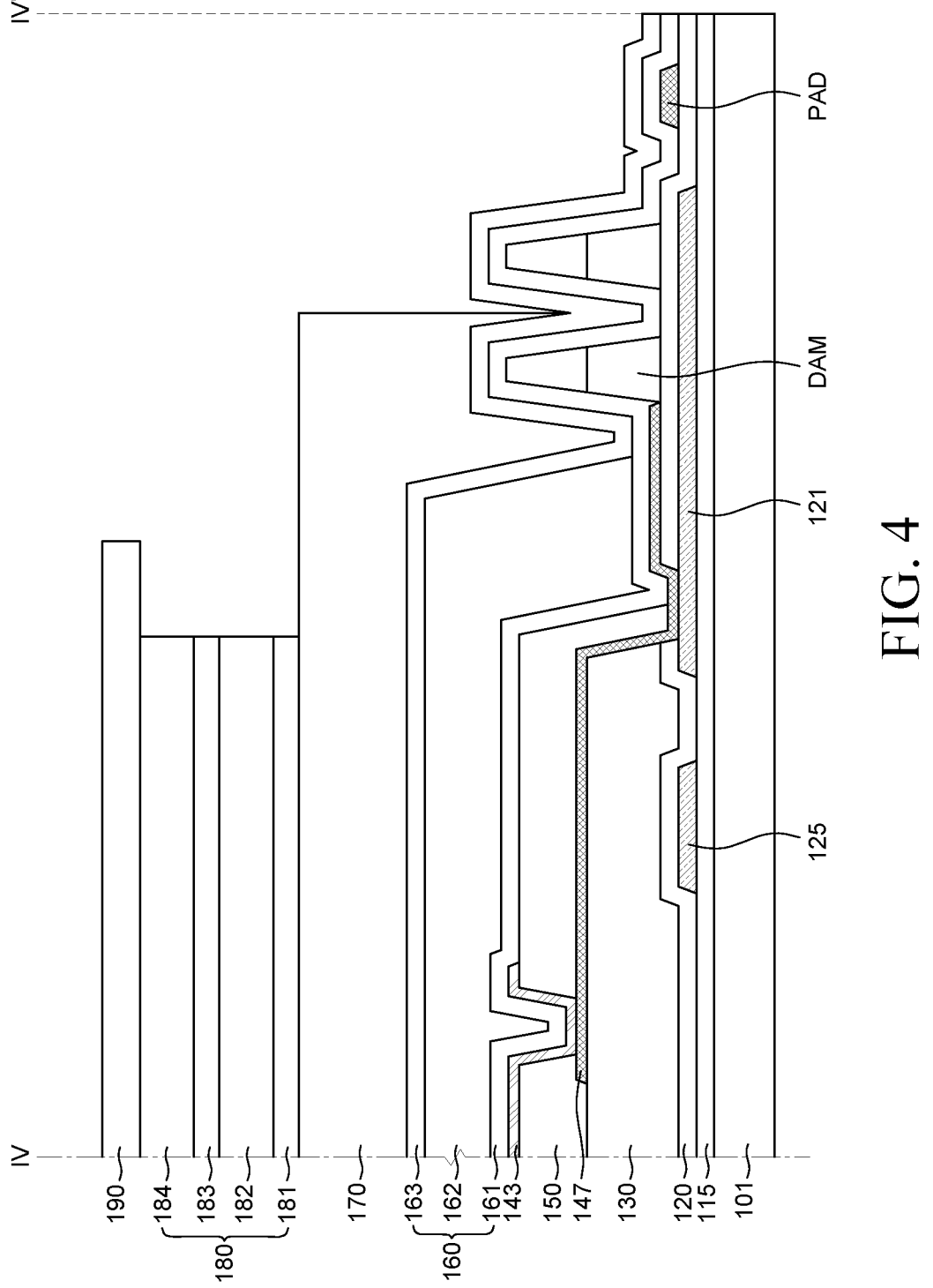
FIG. 4 is a schematic cross-sectional view taken along the line IV-IV' of FIG. 1.

FIG. 4 is a schematic cross-sectional view taken along IV-IV' of FIG. 1. Specifically, FIG. 4 is a cross-sectional view illustrating the non-active area NA of the display device 100.

As described with reference to FIG. 3, the transistor 110 for driving the display device 100 may be disposed on the substrate 101 corresponding to the active area AA and a driving circuit or a wiring line which generates or applies a signal for driving the display device 100 may be disposed on the substrate 101 corresponding to the non-active area NA.

In the non-active area NA, a gate driving circuit 125, a low potential voltage line 121, and a pad PAD may be disposed. The gate driving circuit 125 is connected to each pixel of the active area AA to output a signal for driving the pixel and the low potential voltage line 121 is disposed to be closer to the outside of the substrate 101 than the gate driving circuit 125 and supplies a low potential driving voltage VSS to each pixel. Further, the pad PAD is disposed to be closer to the outside of the substrate 101 than the low potential voltage line 121 so that an external module such as COF is bonded thereto. Specifically, the pad PAD may be referred to as a touch pad. Even though in FIG. 4, only some configurations of the gate driving circuit are illustrated as wiring lines for the convenience of illustration, various components such as a transistor, a capacitor, and a wiring line may be disposed in the gate driving circuit.

The interlayer insulating layer 120 is disposed on the gate driving circuit 125 and the low potential voltage line 121.

The planarization layer 130 is disposed on the interlayer insulating layer 120 overlapping the gate driving circuit 125 to planarize an upper portion thereof and the connection line 147 which is electrically connected to the low potential voltage line 121 is disposed on the planarization layer 130. The connection line 147 may be simultaneously formed of the same material as the anode 141 disposed in the active area AA.

A bank layer 150 including an opening which exposes a partial area of the connection line 147 is formed on the connection line 147.

The cathode 143 which is in contact with the connection line 147 in the opening is disposed on the bank layer 150.

In the meantime, the encapsulation unit 160 including the first inorganic encapsulation layer 161, the organic encapsulation layer 162, and the second inorganic encapsulation layer 163 is disposed on the cathode 143.

The encapsulation unit 160 covers both the active area AA and the non-active area NA of the substrate 101 and suppresses the permeation of the moisture and oxygen into the display device 100.

A dam DAM which blocks the flow of the organic encapsulation layer 162 which configures the encapsulation unit 160 may be disposed in the non-active area NA. Specifically, the dam DAM is disposed in the non-active area NA to block the flow of the organic encapsulation layer 62 which configures the encapsulation unit 160. The dam DAM needs to be formed with a predetermined height or higher to block the flow of the organic encapsulation layer 162. To this end, the dam DAM may be formed of at least one or more layers formed of an organic material. For example, the dam DAM may include a lower layer formed of the same material as the planarization layer 130 and an upper layer formed of the same material as the bank layer 150, but is not limited thereto. But embodiments are not limited thereto. For example, the dam DAM may include a single layer formed of the same material as the planarization layer 130 or a single layer formed of the same material as the bank layer 150, or even a layer formed of a material different from that of the planarization layer 130 and the bank layer 150. Even though two dams DAM are illustrated in the drawing, one or three or more dams DAM may be provided.

The touch panel TP is bonded onto the encapsulation unit 160 by the adhesive layer 170.

The touch panel TP corresponding to the non-active area AA of the display device 100 includes a polarizer 190 disposed on the plurality of touch insulating layers 180. Even though it is not illustrated, a touch routing line TL is disposed on the plurality of touch insulating layers 180 to be connected to the touch electrode TE of the active area AA, but is not limited thereto.

The plurality of touch insulating layers 180 include a touch protection layer 181, a touch interlayer insulating layer 182 on the touch protection layer 181, a barrier layer 183 on the touch interlayer insulating layer 182, and a touch planarization layer 184 on the barrier layer 183.

The polarizer 190 is disposed not only in the active area AA of the substrate 101, but also in the non-active area NA to suppress the reflection of the external light which may be generated in the non-active area NA.

In the related art, after bonding the display panel and the touch panel and detaching a support substrate which supports the display panel and the touch panel, a plurality of touch insulating layers are patterned to open a pad for attaching an external module. However, when the plurality of touch insulating layers are patterned as described above, a stress is concentrated on the plurality of touch insulating layers so that there is a problem in that not only the plurality of touch insulating layers, but also a film disposed below the plurality of touch insulating layers is damaged. Further, the stress is further applied to the plurality of touch insulating layers due to the shrinkage of the polarizer located above the plurality of touch insulating layers so that there is a problem in that the damage of the film disposed below the plurality of touch insulating layers is further increased.

Therefore, in the display device according to the exemplary embodiment of the present disclosure, ends of the plurality of touch insulating layers 180 disposed between the display unit disposed in the active area AA and the plurality of pads PAD are disposed to be spaced apart from an end of the polarizer 190. Therefore, even though the polarizer 190 is shrunk due to a high temperature and high humidity environment, the stress due to the shrinkage of the polarizer 190 is not applied to the plurality of touch insulating layers 180 so that the damage of the film disposed below the plurality of touch insulating layers 180 may be reduced.

For example, the end of the polarizer 190 may protrude more than the ends of the plurality of touch insulating layers 180. Between the end of the polarizer 190 and the adhesive layer 170, specifically, in an area formed by the polarizer 190 which protrudes from the ends of the plurality of touch insulating layers 180, a space may be disposed. The stress concentrated on the plurality of touch insulating layers 180 by the polarizer 190 may be reduced by the above-described space.

The plurality of touch insulating layers 180 are formed by laminating the touch protection layer 181, the touch interlayer insulating layer 182, the barrier layer 183, and the touch planarization layer 184. The touch protection layer 181 is formed of an inorganic insulating material and the touch interlayer insulating layer 182 is formed of an organic insulating material on the touch protection layer 181. The barrier layer 183 is formed of an inorganic insulating material on the touch interlayer insulating layer 182, and the touch planarization layer 184 is formed of an organic insulating material on the barrier layer 183. At this time, the touch protection layer 181, the touch interlayer insulating layer 182, the barrier layer 183, and the touch planarizing layer 184 have different thicknesses. For example, the thicknesses of the touch interlayer insulating layer 182 and the touch planarization layer 184 which are formed of an organic insulating material may be larger than the thicknesses of the touch protection layer 181 and the barrier layer 183 which are formed of an inorganic insulating material. Therefore, layers formed of an organic insulating material and layers formed of inorganic insulating material are alternately laminated so that even though a damage, such as a crack, is generated in the layers 181 and 183 formed of the inorganic insulating material, the spreading of the damage is suppressed by the layers 182 and 184 formed of the organic insulating material.

Further, the polarizer 190 is disposed on the touch planarization layer 184 formed of an organic insulating material. Therefore, even though the polarizer 190 is shrunk in the high temperature and high humidity environment, the shrinkage of the polarizer 190 is cancelled by the touch planarization layer 184 so that the damage of the plurality of touch insulating layers 180 caused by the shrinkage of the polarizer 190 is suppressed in advance.

Further, the ends of the plurality of touch insulating layers 180 and the end of the polarizer 190 overlap the organic encapsulation layer 162 of the encapsulation unit 160. Accordingly, during the process of patterning the plurality of touch insulating layers 180 to open the pad PAD, even though the stress is concentrated on the plurality of touch insulating layers 180 to cause the damage of the plurality of touch insulating layers 180 or the polarizer 190 is shrunk to cause the stress to be concentrated on the end of the polarizer 190, the spreading of the damage, such as a crack, caused by the plurality of touch insulating layers 180 and the polarizer 190 to the light emitting diode 140 may be suppressed by the organic encapsulation layer 162.

Further, the ends of the plurality of touch insulating layers 180 also overlap the planarization layer 130. Therefore, during the process of patterning the plurality of touch insulating layers 180, even though the stress is concentrated on the plurality of touch insulating layers 180 to cause the damage of the plurality of touch insulating layers 180, the spreading of the damage caused by the plurality of touch insulating layers 180 to the light emitting diode 140 is suppressed by the organic encapsulation layer 162. Further, the spreading of the damage, such as a crack, caused by the plurality of touch insulating layers 180 to the transistor 110 may be suppressed by the planarization layer 130.

Figure 5:
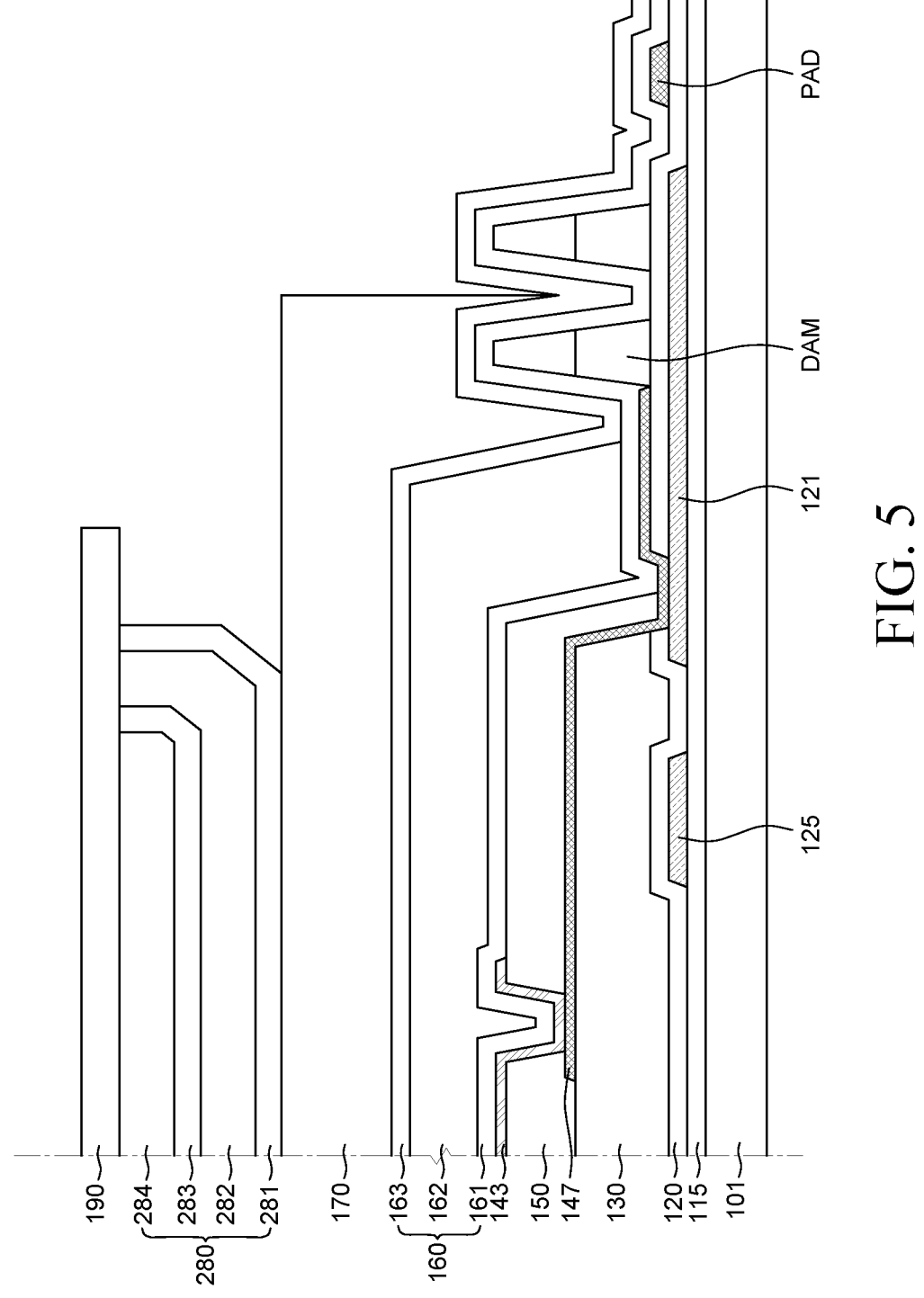
FIG. 5 is a schematic cross-sectional view of a display device according to another exemplary embodiment of the present disclosure.

FIG. 5 is a schematic cross-sectional view of a display device according to another exemplary embodiment of the present disclosure. Specifically, FIG. 5 is a cross-sectional view illustrating the non-active area NA of the display device 200. The display device 200 illustrated in FIG. 5 is substantially the same as the display device 100 illustrated in FIGS. 1 to 4 except for the configuration of a plurality of touch insulating layers 280, so that a redundant description will be omitted.

As described above, the plurality of touch insulating layers 280 are disposed to be spaced apart from the end of the polarizer 190, but the plurality of touch insulating layers 280 are disposed to overlap the organic encapsulation layer 162 of the encapsulation unit 160. By doing this, during the process of patterning the plurality of touch insulating layers 280 to open the pad PAD, the damage of the plurality of touch insulating layers 280 or the damage of the film disposed below the plurality of touch insulating layers 280 due to the damage caused by the plurality of touch insulating layers 280 which are caused by the stress which is concentrated on the plurality of touch insulating layers 280 may be suppressed.

At this time, referring to FIG. 5, the display device 200 according to another exemplary embodiment of the present disclosure includes a plurality of touch insulating layers 280 having ends located in different positions. For example, a touch protection layer 281, a touch interlayer insulating layer 282, a barrier layer 283, and a touch planarizing layer 284 have different lengths.

Specifically, the plurality of touch insulating layers 280 are configured to include the touch protection layer 281, the touch interlayer insulating layer 282, the barrier layer 283, and the touch planarization layer 284. The touch interlayer insulating layer 282 is disposed on the touch protection layer 281 and all of a lower surface and side surfaces of the touch interlayer insulating layer 282 are enclosed by the touch protection layer 281. The barrier layer 283 is disposed on the touch interlayer insulating layer 282 and all of a lower surface and side surfaces of the barrier layer 283 are enclosed by the touch interlayer insulating layer 282. Further, the touch planarization layer 284 is disposed on the barrier layer 283 and all of a lower surface and side surfaces of the touch planarization layer 284 are enclosed by the barrier layer 283.

At this time, the touch protection layer 281 and the barrier layer 283 formed of an inorganic insulating material and the touch interlayer insulating layer 282 and the touch planarization layer 284 formed of an organic insulating material are alternately disposed. At this time, each layer of the plurality of touch insulating layers 280 is configured so as to completely enclose a layer disposed thereabove so that even though a damage, such as a crack, is generated in the plurality of touch insulating layers 280, layers having different properties are alternately disposed to suppress the spreading of the damage. Therefore, the spreading of the damage caused by the plurality of touch insulating layers 280 to the lower stage of the plurality of touch insulating layers 280 may be suppressed.

For example, the touch interlayer insulating layer 282 and the touch planarization layer 284 formed of an organic insulating material are disposed so as to be completely enclosed by the touch protection layer 281 and the barrier layer 283 formed of an inorganic insulating material. Therefore, even though the damage, such as a crack, is generated in the plurality of touch insulating layers 280, the damage is dispersed, that is, the spreading of the damage is suppressed, by the touch interlayer insulating layer 282 and the touch planarization layer 284 formed of an organic insulating material. Consequently, the spreading of the damage caused by the plurality of touch insulating layers 280 to the lower stage of the plurality of touch insulating layers 280 may be suppressed.

Hereinafter, the effects of the present disclosure will be described in more detail with reference to Examples and Comparative Examples. However, the following Examples are set forth to illustrate the present disclosure, but the scope of the disclosure is not limited thereto.

In order to find out the effect of the present disclosure, as Example, as illustrated in FIG. 4, a display device 100 in which an end of the polarizer 190 and ends of the plurality of touch insulating layers 180 were disposed to be spaced apart from each other and the end of the polarizer 190 and the ends of the plurality of touch insulating layers 180 were disposed in an area overlapping the organic encapsulation layer 162 was used. As Comparative Example, a display device in which an end of the polarizer and ends of the plurality of touch insulating layer overlapped and the end of the polarizer and the ends of the plurality of touch insulating layers were disposed in an area protruding from the organic encapsulation layer was used. By doing this, the reliability was evaluated for 504 hours under a temperature and humidity condition represented in Table 1.

Specifically, in a state in which the display device 100 is statically folded, that is, in a static folding state in which the display device 100 was fastened with a static folding jig to fold, the static folding jig was put in a reliability evaluation chamber and the reliability was evaluated for 504 hours under the temperature and humidity condition represented in Table 1. Further, in a flat state in which the display device 100 was not folded, the display device was put in the reliability evaluation chamber to evaluate the reliability for 504 hours under the temperature and humidity condition represented in Table 1.

At this time, 10 display devices were used for each condition to evaluate the reliability and the number of display devices in which moisture permeation defect occurred within 504 hours was indicated as failure (F) and the time when the moisture permeation defect occurred was indicated in parentheses.

TABLE 1

| | Static folding | | Static folding | | Flat | |
|---|---|---|---|---|---|---|
| | Tem. | Humidity | Tem. | Humidity | Tem. | Humidity |
| Evaluation | (° C.) | (RH %) | (° C.) | (RH %) | (° C.) | (RH %) |
| condition | 60 | 90 | 75 | 90 | 75 | 90 |
| Ex. | 0 F | | 0 F | | 0 F | |
| Comp. Ex. | 0 F | | 4 F (288 hr 1 ea, 336 hr 1 ea, 504 hr 2 ea) | | 5 F (336 hr 1 ea, 504 hr 4 ea) | |

As represented in Table 1, it is confirmed that in both a static folding state and a flat state of the display device, even though the high temperature and high humidity condition is changed, the display device of Example shows a superior reliability to the display device of Comparative Example.

The exemplary embodiments of the present disclosure can also be described as follows:

According to an aspect of the present disclosure, a display device, comprising: a first substrate including an active area and a non-active area which encloses the active area; a display unit disposed on an upper surface of the first substrate; an encapsulation unit which covers the display unit; a touch panel disposed on the encapsulation unit; an adhesive layer which bonds the touch panel and the first substrate; and a polarizer disposed on the touch panel, wherein the touch panel includes a plurality of touch insulating layers and a touch electrode and ends of the plurality of touch insulating layers are spaced apart from an end of the polarizer.

The encapsulation unit includes a first inorganic encapsulation layer, an organic encapsulation layer on the first inorganic encapsulation layer, and a second inorganic encapsulation layer on the organic encapsulation layer, and the end of the polarizer and the ends of the plurality of touch insulating layers may overlap the organic encapsulation layer.

The display unit includes a transistor, a planarization layer which covers the transistor, and a light emitting diode which is disposed on the planarization layer and electrically connected to the transistor and the ends of the plurality of touch insulating layers may overlap the planarization layer.

The end of the polarizer may protrude from the ends of the plurality of touch insulating layers.

A space may be disposed between the end of the polarizer and the adhesive layer.

The plurality of touch insulating layers include a touch protection layer, a touch interlayer insulating layer on the touch protection layer, a barrier layer on the touch interlayer insulating layer, and a touch planarization layer on the barrier layer and positions of ends of the touch protection layer, the touch interlayer insulating layer, the barrier layer, and the touch planarization layers may be different from each other.

The touch protection layer, the touch interlayer insulating layer, the barrier layer, and the touch planarization layers may have different lengths.

The touch protection layer, the touch interlayer insulating layer, the barrier layer, and the touch planarization layers may have different thicknesses.

The touch interlayer insulating layer whose lower surface and side surfaces are enclosed by the touch protection layer is disposed on the touch protection layer, the barrier layer whose lower surface and side surfaces are enclosed by the touch interlayer insulating layer is disposed on the touch interlayer insulating layer, the touch planarization layer whose lower surface and side surfaces are enclosed by the barrier layer is disposed on the barrier layer, and the polarizer may be disposed on the touch planarization layer.

The display device may further comprise a plurality of pads disposed in the non-active area; ends of the plurality of touch insulating layers and the end of the polarizer may be disposed between the display unit and the plurality of pads.

The display device may further comprise a folding axis which is present in the active area and the non-active area and folds the display device.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a first substrate including an active area and a non-active area which encloses the active area;
a display unit disposed on an upper surface of the first substrate;
an encapsulation unit which covers the display unit;
an adhesive layer disposed on the encapsulation unit;
a touch panel disposed on the adhesive layer;
a polarizer disposed on the touch panel; and
a folding axis which is present in the active area and the non-active area and folds the display device,
wherein the touch panel includes a plurality of touch insulating layers and a touch electrode, and ends of the plurality of touch insulating layers are spaced apart from an end of the polarizer,
wherein the adhesive layer bonds the touch panel and the first substrate.

2. The display device according to claim 1, wherein the encapsulation unit includes a first inorganic encapsulation layer, an organic encapsulation layer on the first inorganic encapsulation layer, and a second inorganic encapsulation layer on the organic encapsulation layer, and the end of the polarizer and the ends of the plurality of touch insulating layers overlap the organic encapsulation layer.

3. The display device according to claim 1, wherein the display unit includes a transistor, a planarization layer which covers the transistor, and a light emitting diode which is disposed on the planarization layer and electrically connected to the transistor, and the ends of the plurality of touch insulating layers overlap the planarization layer.

4. The display device according to claim 1, wherein the end of the polarizer protrudes from the ends of the plurality of touch insulating layers.

5. The display device according to claim 1, wherein a space is disposed between the end of the polarizer and the adhesive layer.

6. A display device, comprising:
a first substrate including an active area and a non-active area which encloses the active area;
a display unit disposed on an upper surface of the first substrate;
an encapsulation unit which covers the display unit;
an adhesive layer disposed on the encapsulation unit;
a touch panel disposed on the adhesive layer; and
a polarizer disposed on the touch panel,
wherein the touch panel includes a plurality of touch insulating layers and a touch electrode, and ends of the plurality of touch insulating layers are spaced apart from an end of the polarizer,
wherein the adhesive layer bonds the touch panel and the first substrate,
wherein the plurality of touch insulating layers include a touch protection layer, a touch interlayer insulating layer on the touch protection layer, a barrier layer on the touch interlayer insulating layer, and a touch planarization layer on the barrier layer, and
wherein positions of ends of the touch protection layer, the touch interlayer insulating layer, the barrier layer, and the touch planarization layers are different from each other.

7. The display device according to claim 6, wherein the touch protection layer, the touch interlayer insulating layer, the barrier layer, and the touch planarization layers have different lengths.

8. The display device according to claim 6, wherein the touch protection layer, the touch interlayer insulating layer, the barrier layer, and the touch planarization layers have different thicknesses.

9. The display device according to claim 6, wherein the touch interlayer insulating layer whose lower surface and side surfaces are enclosed by the touch protection layer is disposed on the touch protection layer, the barrier layer whose lower surface and side surfaces are enclosed by the touch interlayer insulating layer is disposed on the touch interlayer insulating layer, the touch planarization layer whose lower surface and side surfaces are enclosed by the barrier layer is disposed on the barrier layer, and the polarizer is disposed on the touch planarization layer.

10. The display device according to claim 1, further comprising:
a plurality of pads disposed in the non-active area;
wherein ends of the plurality of touch insulating layers and the end of the polarizer are disposed between the display unit and the plurality of pads.

11. The display device according to claim 1, wherein the plurality of touch insulating layers includes a touch planarization layer formed of an organic insulating material, and wherein the polarizer is disposed on the touch planarization layer.

12. A display device, comprising:
a first substrate including an active area and a non-active area which encloses the active area;
a display unit disposed on an upper surface of the first substrate;
an encapsulation unit which covers the display unit;
an adhesive layer disposed on the encapsulation unit;
a touch panel disposed on the adhesive layer; and
a polarizer disposed on the touch panel,
wherein the touch panel includes a plurality of touch insulating layers and a touch electrode, and ends of the plurality of touch insulating layers are spaced apart from an end of the polarizer,
wherein the adhesive layer bonds the touch panel and the first substrate, and
wherein the plurality of touch insulating layers includes:
a touch protection layer on which a connection electrode configured to connect the touch electrodes is disposed;
a touch interlayer insulating layer disposed on the connection electrode and the touch protection layer and configured to insulate the connection electrode from the touch electrode;
a barrier layer disposed on the touch interlayer insulating layer to cover the touch electrodes; and
a touch planarization layer disposed on the barrier layer.

13. The display device according to claim 12, wherein the touch protection layer and the barrier layer are formed of an inorganic insulating material and the touch interlayer insulating layer and the touch planarization layer are formed of an organic insulating material.

14. The display device according to claim 13, wherein a thicknesses of the touch interlayer insulating layer and the touch planarization layer is larger than a thicknesses of the touch protection layer and the barrier layer.

\* \* \* \* \*